(12) United States Patent
Lee et al.

(10) Patent No.: US 10,978,430 B2
(45) Date of Patent: Apr. 13, 2021

(54) DISPLAY APPARATUS AND MANUFACTURING METHOD THEREOF

(71) Applicant: SAMSUNG ELECTRONICS CO., LTD., Suwon-si (KR)

(72) Inventors: Dong Yeob Lee, Suwon-si (KR); Byung Chul Kim, Suwon-si (KR); Seung Ryong Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/557,350

(22) Filed: Aug. 30, 2019

(65) Prior Publication Data

US 2020/0075559 A1 Mar. 5, 2020

(30) Foreign Application Priority Data

Aug. 31, 2018 (KR) ........................ 10-2018-0103482

(51) Int. Cl.
*H01L 25/075* (2006.01)
(52) U.S. Cl.
CPC ................................ *H01L 25/0753* (2013.01)
(58) Field of Classification Search
CPC ..... H01L 25/0753; H01L 33/54; H01L 33/58; H01L 2933/005; G02F 1/133603; G02F 1/133611
See application file for complete search history.

(56) References Cited

U.S. PATENT DOCUMENTS

| 2007/0182297 | A1 | 8/2007 | Drazic et al. |
| 2009/0073080 | A1 | 3/2009 | Meersman et al. |
| 2013/0029439 | A1 | 1/2013 | Song et al. |
| 2019/0285942 | A1* | 9/2019 | Liu .................. G02F 1/133611 |

FOREIGN PATENT DOCUMENTS

| JP | 2009-520214 A | 5/2009 |
| KR | 10-2013-0039569 A | 4/2013 |

OTHER PUBLICATIONS

Communication dated Dec. 27, 2019 issued by the International Searching Authority in counterpart Application No. PCT/KR2019/011192 (PCT/ISA/210).

* cited by examiner

*Primary Examiner* — Changhyun Yi
(74) *Attorney, Agent, or Firm* — Sughrue Mion, PLLC

(57) ABSTRACT

A display apparatus includes unit modules arranged in a matrix form; a transparent fixing member encapsulating the unit modules and fixing the unit modules; and a glass panel fixed to the unit modules by means of the transparent fixing member.

16 Claims, 10 Drawing Sheets

DISPLAY APPARATUS AND MANUFACTURING METHOD THEREOF

CROSS-REFERENCE TO RELATED APPLICATION

This application is based on and claims priority under 35 U.S.C. § 119 to Korean Patent Application No. 10-2018-0103482 filed on Aug. 31, 2018, in the Korean Intellectual Property Office, the disclosure of which is incorporated by reference herein in its entirety.

BACKGROUND

1. Field

The disclosure relates to a display apparatus in which an inorganic light emitting device is mounted directly on a substrate, and a method of manufacturing the display apparatus.

2. Description of the Related Art

A display apparatus is a kind of output apparatus that visually displays images and data information, such as characters, figures, etc. Examples of display apparatuses may include a computer monitor, a TV, etc.

Demands for a display apparatus with a larger screen along with increased brightness, high resolution, high efficiency, and low power of these display apparatuses are increasing more and more.

Recently, an organic light emitting diode (OLED) panel is being considered as a type of a display apparatus which could replace the light crystal display (LCD) panel. However, the OLED panel technology still has many concerns and limitations that have to be solved and improved upon, such as high price due to low yield, securing reliability according to enlargement, and securing durability against external environmental conditions such as water.

Thus, as a new product that can replace or complement the LCD and OLED panels, a display panel manufactured by mounting inorganic light emitting devices, which emit light of Red (R), Green (G), and Blue (B) colors, directly on a substrate is being studied and developed.

A display panel using the above-described inorganic light emitting devices is manufactured by mounting the inorganic light emitting devices of several to hundreds of micrometers (μm) in size delivered from a wafer on a substrate.

SUMMARY

Therefore, it is an aspect of the disclosure to provide a miniaturized display apparatus including inorganic light emitting devices.

Additional aspects of the disclosure will be set forth in part in the description which follows and, in part, will be obvious from the description, or may be learned by practice of the disclosure.

An aspect of the disclosure is to provide a display apparatus capable of being manufactured in a reduced size.

According to an aspect of the disclosure, there is provided a display apparatus including: a plurality of unit modules arranged in a matrix form; a transparent fixing member encapsulating the plurality of unit modules and fixing the plurality of unit modules; and a glass panel disposed on the plurality of unit modules by means of the transparent fixing member.

The transparent fixing member may be formed based on a transparent resin being applied on the plurality of unit modules and the transparent resin being hardened.

A portion of the transparent resin may enter a gap between adjacent unit modules of the plurality of unit modules and the transparent resin may be hardened in the gap.

The transparent resin may be an ultraviolet (UV) hardening resin configured to be hardened based on UV light being radiated onto the transparent resin.

The transparent fixing member may include a transparent adhesive film that is attached on the front surfaces of the plurality of unit modules.

Each of the plurality of unit modules may include: a substrate; and a plurality of inorganic light emitting devices mounted on the substrate and configured to form pixels.

Each of the plurality of inorganic light emitting devices may include a plurality of light emitting device groups, each of the plurality of light emitting device groups including: a red inorganic light emitting device; a green inorganic light emitting device; and a blue inorganic light emitting device, the red, green and blue inorganic light emitting device configured to form a pixel.

The plurality of light emitting device groups may be spaced at a predetermined interval.

The display apparatus may further include a case to cover at least one outer side surface of the unit modules disposed at outermost of the plurality of unit modules.

According to another aspect of the disclosure, there is provided a method of manufacturing a display apparatus including: forming a unit module of a plurality of unit modules by mounting a plurality of inorganic light emitting devices on a substrate; arranging the plurality of unit modules in a matrix form; applying a transparent resin in a liquid state to cover the plurality of unit modules; attaching a glass panel to the plurality of unit modules by means of the transparent resin; and hardening the transparent resin to form a transparent fixing member for fixing the plurality of unit modules.

The arranging may include arranging the plurality of unit modules in the matrix form on a jig.

The jig includes: a resting portion on which the plurality of unit modules are provided, and a plurality of adsorption holes provided in the resting portion corresponding to the plurality of unit modules. Based on negative pressure being applied to the plurality of adsorption holes, the plurality of unit modules may be adsorbed on the resting portion.

The jig may further include a dam portion positioned at surrounding edges of the resting portion. The transparent resin in the liquid state applied on the plurality of unit modules may be collected in the resting portion by the dam portion.

The jig may further include a blocking portion covering a lower end of a gap provided between adjacent unit modules to limit an amount of the transparent resin entering the gap.

According to another aspect of the disclosure, there is provided a method of manufacturing a display apparatus including: arranging, in a jig, a plurality of unit modules in a matrix form, each of the plurality of unit modules including: a substrate; and a plurality of inorganic light emitting devices provided on the substrate; applying a transparent resin in a liquid state in the jig to cover the plurality of unit modules; attaching a glass panel to the plurality of unit modules by means of the transparent resin; and hardening the transparent resin to form a transparent fixing member for fixing the plurality of unit modules.

The arranging, in the jig, the plurality of unit modules may include arranging adjacent unit modules with a gap between the adjacent unit modules.

The applying the transparent resin in the liquid state includes: providing the transparent resin in the liquid state in the gap between the adjacent unit modules, and hardening the transparent resin in the liquid state in the gap between the adjacent unit modules to fix the adjacent unit modules.

BRIEF DESCRIPTION OF THE DRAWINGS

The above and/or other aspects of the disclosure will become apparent and more readily appreciated from the following description of the embodiments, taken in conjunction with the accompanying drawings of which.

DETAILED DESCRIPTION

Figure 1:
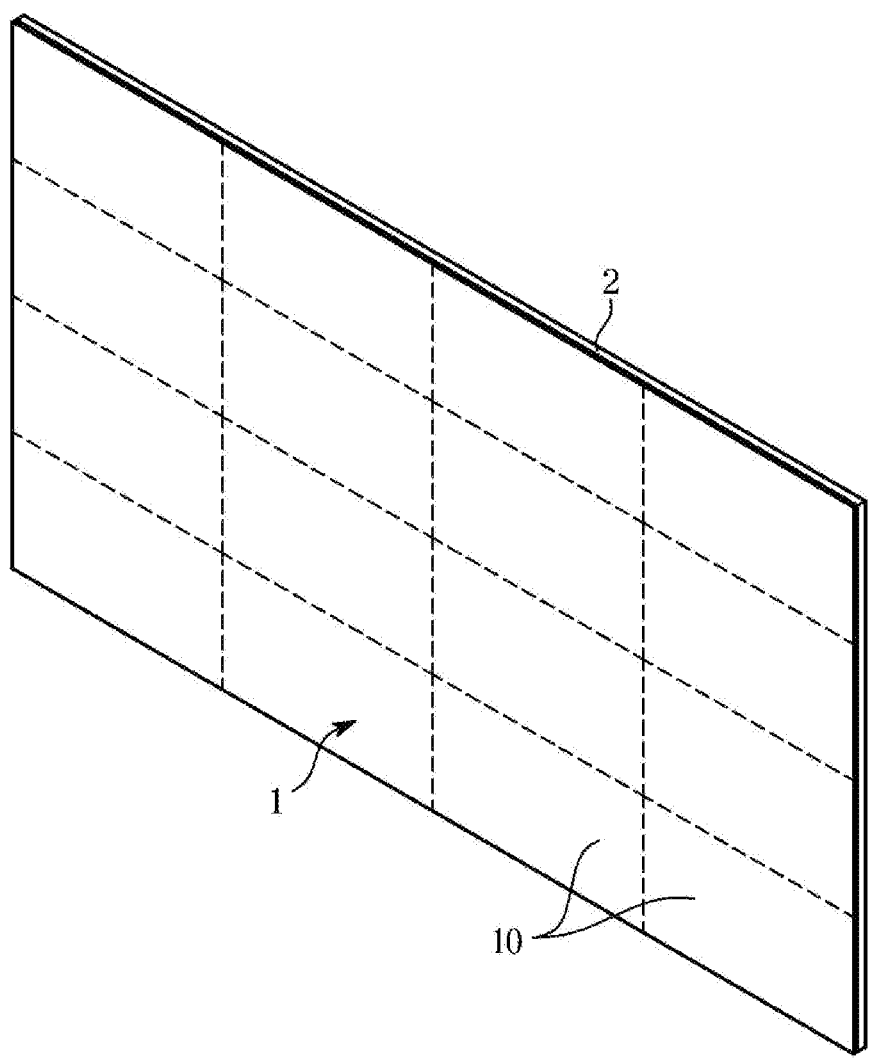
FIG. 1 is a perspective view of a display apparatus according to an embodiment of the disclosure.

Configurations illustrated in embodiments and the drawings described in the disclosure are only the preferred embodiments of the disclosure, and thus it is to be understood that various modified examples, which may replace the embodiments and the drawings described in the specification, are possible when filing the application.

Also, like reference numerals or symbols denoted in the drawings of the specification represent members or components that perform the substantially same functions.

The terms used in the specification are merely used to describe embodiments, and are not intended to limit the disclosure. An expression used in the singular encompasses the expression of the plural, unless it has a clearly different meaning in the context. In the specification, it is to be understood that the terms such as "comprising", "including" or "having", etc., are intended to indicate the existence of the features, numbers, operations, components, parts, or combinations thereof disclosed in the specification, and are not intended to preclude the possibility that one or more other features, numbers, operations, components, parts, or combinations thereof may exist or may be added.

It will be understood that, although the terms "first", "second", etc., may be used herein to describe various elements, these elements should not be limited by these terms. The above terms are used only to distinguish one component from another. For example, a first component discussed below could be termed a second component, and similarly, a second component may be termed a first component without departing from the teachings of this disclosure. As used herein, the term "and/or" includes any and all combinations of one or more of associated listed items.

Meanwhile, in the following description, the terms "upper portion" and "lower portion", "upper surface" and "lower surface", and "front surface" and "rear surface" are defined based on the drawings, and the shapes and positions of the components are not limited by the terms.

Hereinafter, a display apparatus according to an embodiment of the disclosure will be described in detail with reference to the accompanying drawings.

Figure 2:
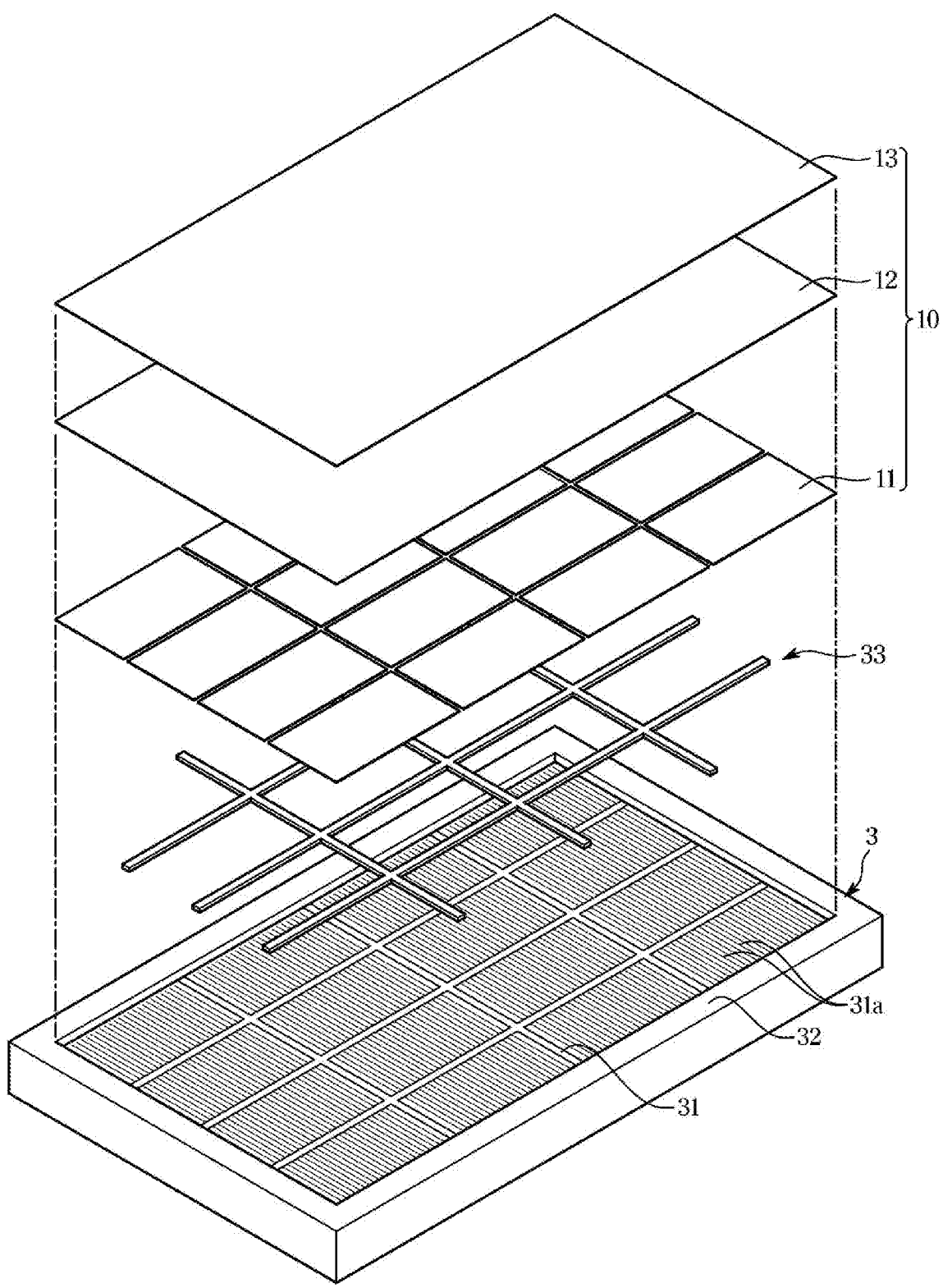
FIG. 2 is an exploded perspective view of a display panel used in a display apparatus according to an embodiment of the disclosure, and a jig for manufacturing the display panel.

FIG. 1 is a perspective view of a display apparatus 1 according to an embodiment of the disclosure. FIG. 2 is an exploded perspective view of a display panel 10 used in a display apparatus 1 according to an embodiment of the disclosure, and a jig 3 for manufacturing the display panel. Referring to FIG. 1, the display apparatus 1 may include a display panel 10 on which an image is displayed, and a case 2 accommodating the display panel 10 and forming side and rear surfaces of the display apparatus 1. As shown in FIG. 1, the display apparatus 1 may include a plurality of display panels 10 arranged in a matrix form. For example, the embodiment of the display panel 1 in FIG. 1 is formed in a 4×4 matrix. However, the embodiments are not limited thereto.

The case 2 includes a side portion to cover side surfaces of the display panel and a rear portion to cover and support a rear surface of the display panel. The side portion and the rear portion of the case 2 may be integrally formed or separately formed.

Referring to FIG. 2, the display panel 10 may include a plurality of unit modules 11 arranged to be adjacent to one another in the form of a M×N matrix in up and down and/or left and right directions, a transparent fixing member 12 for fixing the plurality of unit modules 11 in the form of the M×N matrix, and a glass panel 13 positioned in front of the unit modules 11 through the transparent fixing member 12.

In FIG. 2, the plurality of unit modules 11, the transparent fixing member 12, and the glass panel 13 are shown as if they are separable components, for convenience of description, however, the plurality of unit modules 11 and the glass panel 13 may be integrated into one body through the transparent fixing member 12 formed therebetween to form the display panel 10.

As described above, since the display panel 1 includes a plurality of unit modules 11, the rear portion of the case supports rear surfaces of the plurality of unit modules 11.

In addition, since the display panel 1 includes a plurality of unit modules 11, a transparent fixing member 12 and a glass panel 13, the side portion of the case 2 covers and supports at least one outer side surface of the unit modules disposed at outermost of the plurality of unit modules 11, side surfaces of the transparent fixing member 12 and side surfaces of the glass panel 13.

Figure 3:
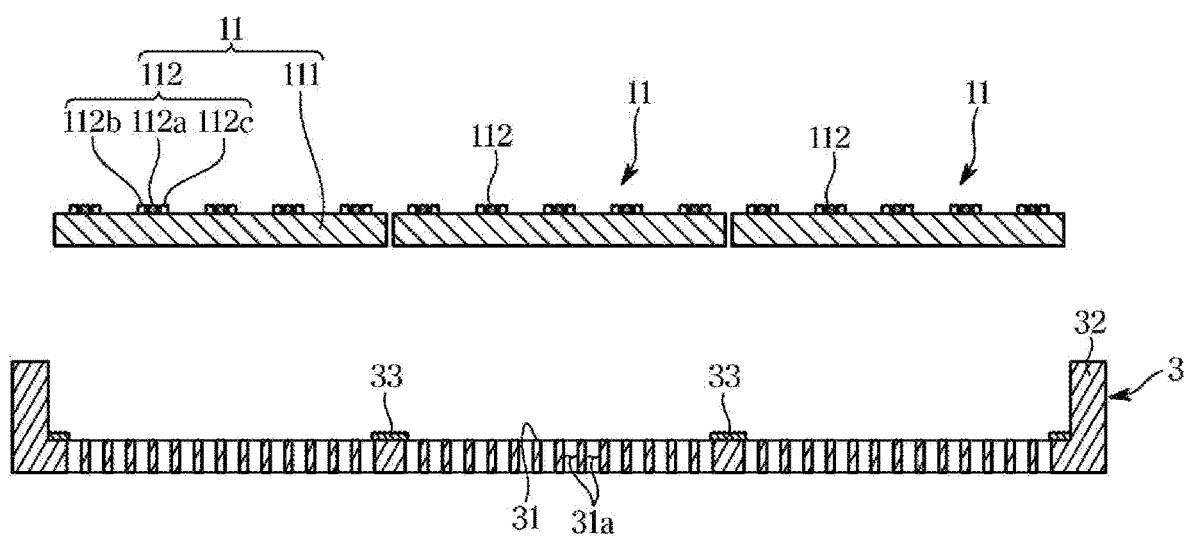
FIG. 3 is a cross-sectional view of unit modules and a jig in a display apparatus according to an embodiment of the disclosure.
Figure 4:
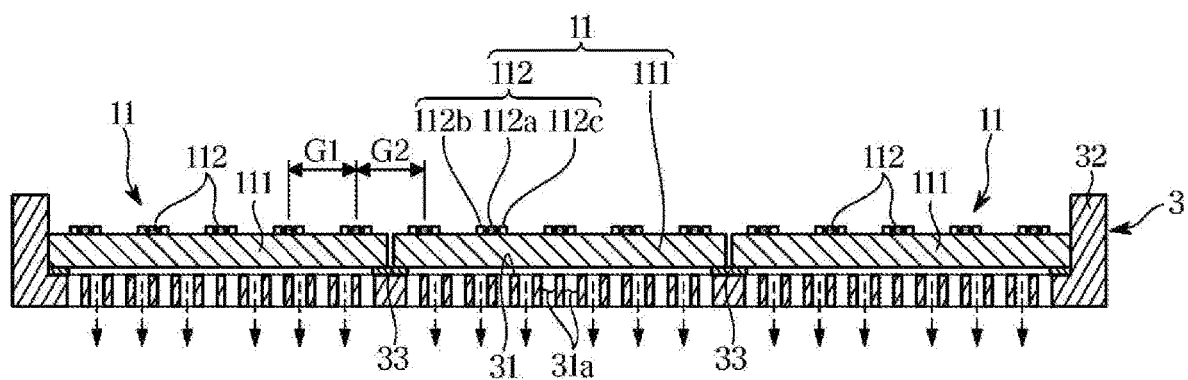
FIG. 4 is a cross-sectional view showing a state in which unit modules are rested on a resting portion of a jig in a display apparatus according to an embodiment of the disclosure.

FIG. 3 is a cross-sectional view of a plurality of unit modules 11 and a jig 3 in a display apparatus 1 according to an embodiment of the disclosure. FIG. 4 is a cross-sectional view showing a state in which plurality of unit modules 11 are rested on a resting portion 31 of a jig 3 in a display apparatus 1 according to an embodiment of the disclosure.

Referring to FIGS. 3 and 4, each of the plurality of unit modules 11 may include a substrate 111 and a plurality of inorganic light emitting devices 112a, 112b, and 112c mounted on the substrate 111.

The substrate 111 may be made of a polymer or a composite material, such as polyimide (PI), FR4, glass, etc. The substrate 111 may include a plurality of electrodes for being electrically connected to the inorganic light emitting devices 112a, 112b, and 112c on one surface of the substrate 111.

The inorganic light emitting devices 112a, 112b, and 112c may be light emitting devices made of an inorganic material, and have higher power efficiency than organic light emitting diodes (OLEDs), in addition to having a longer lifecycle due to higher durability than the OLEDs.

The inorganic light emitting devices 112a, 112b, and 112c may include a red inorganic light emitting device 112a generating a red light, a green inorganic light emitting device 112b generating a green light, and a blue inorganic light emitting device 112c generating a blue light.

The inorganic light emitting devices 112a, 112b, and 112c may be picked up from a source wafer and mounted directly on the substrate 111. The plurality of inorganic light emitting devices 112a, 112b, and 112c may be picked up or transported by an electrostatic method using an electrostatic head or an adhesive method using an elastic polymer material such as polydimethylsiloxane (PDMS) or silicon as a head. Each of the inorganic light emitting devices 112a, 112b, and 112c may have horizontal and vertical lengths and heights of several to hundreds of micrometers ($\mu$m) in size.

The plurality of inorganic light emitting devices 112a, 112b, and 112c may include a p-n diode, a first contact electrode, and a second contact electrode, and be in the form of a flip chip in which the first contact electrode and the second contact electrode are arranged in the same direction. The first contact electrode and the second contact electrode of each of the plurality of inorganic light emitting devices 112a, 112b, and 112c may be connected to the electrodes of the substrate 111 through soldering.

In the embodiment, the red inorganic light emitting device 112a, the green inorganic light emitting device 112b, and the blue inorganic light emitting device 112c may form a light emitting device group 112. A plurality of light emitting device groups 112 may be arranged at regular intervals on the substrate 111 of each unit module 11. In the embodiment, each light emitting device group 112 forms a single pixel.

The red inorganic light emitting device 112a, the green inorganic light emitting device 112b, and the blue inorganic light emitting device 112c may be aligned in a line or arranged in a triangle shape. However, the embodiment is not limited there to. For example, the red inorganic light emitting device 112a, the green inorganic light emitting device 112b, and the blue inorganic light emitting device 112c may be arranged in any other shape based on design intent.

Also, referring to FIG. 4, an interval G1 between the adjacent light emitting device groups 112 arranged on one unit module 11 may be equal to an interval G2 between light emitting device groups 112 arranged to be adjacent to each other on two neighboring unit modules 11 among the plurality of unit modules 11. Accordingly, each of the plurality of light emitting device groups 112 may form a pixel of the display panel 10 having the same interval between the adjacent light emitting device groups 112.

Figure 5:
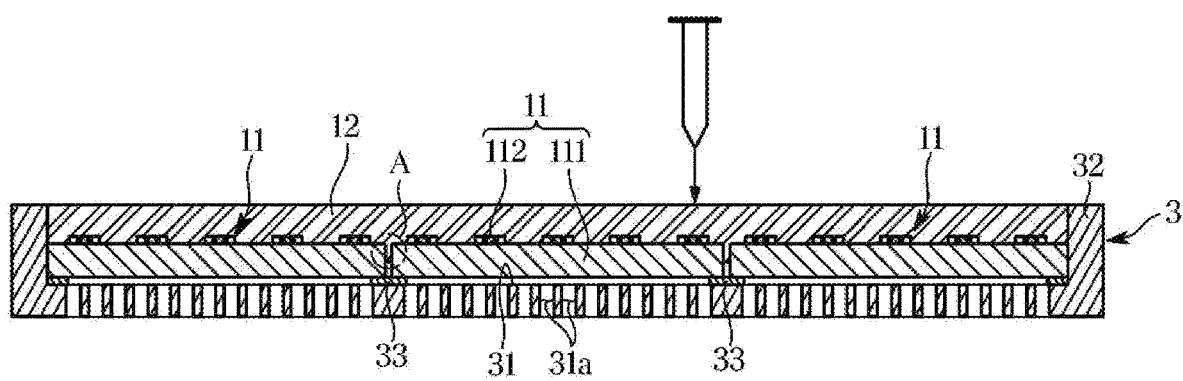
FIG. 5 is a cross-sectional view showing a state in which a transparent resin is applied on upper surfaces of unit modules in a display apparatus according to an embodiment of the disclosure.
Figure 6:
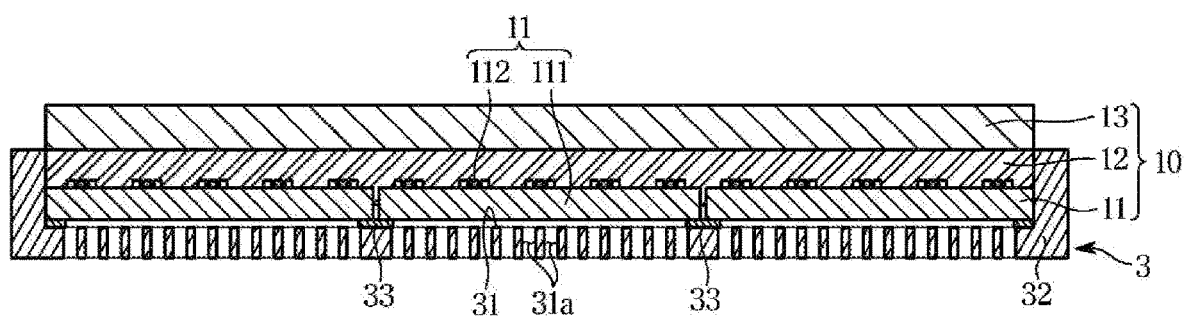
FIG. 6 is a cross-sectional view showing a state in which a glass panel is covered on an upper surface of a transparent resin in a display apparatus according to an embodiment of the disclosure.
Figure 7:
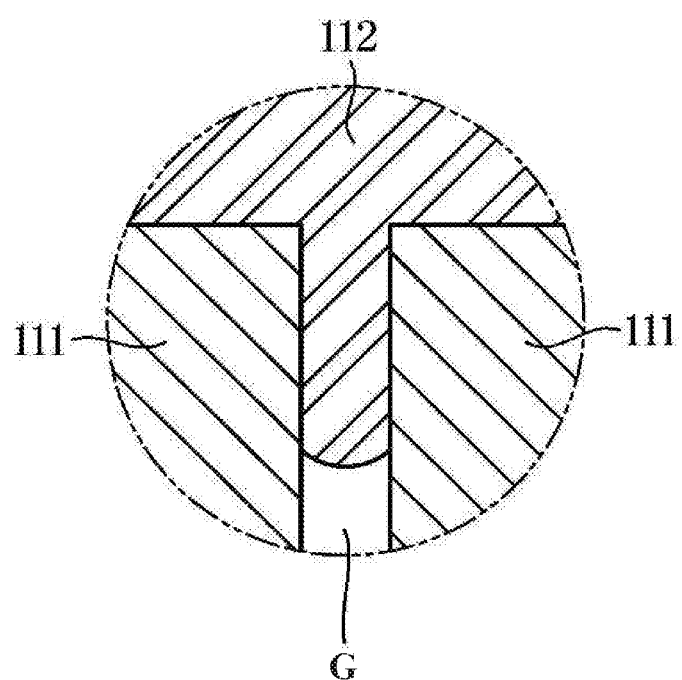
FIG. 7 is an enlarged view of an area A of FIG. 5.
Figure 10:
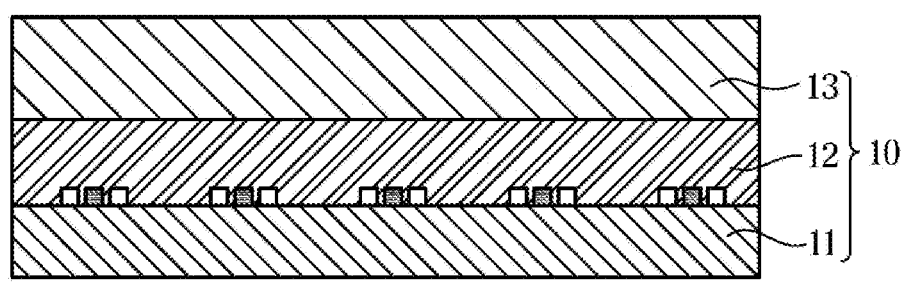
FIG. 10 is a cross-sectional view of a display panel used in a display apparatus according to another embodiment of the present disclosure.

FIG. 5 is a cross-sectional view showing a state in which a transparent resin is applied on upper surfaces of a plurality of unit modules 11 in a display apparatus 1 to form a transparent fixing member 12 according to an embodiment of the disclosure. FIG. 6 is a cross-sectional view showing a state in which a glass panel 13 is covered on an upper surface of a transparent fixing member 12 in a display apparatus 1 according to an embodiment of the disclosure. FIG. 7 is an enlarged view of an area A of FIG. 5. FIG. 10 is a cross-sectional view of a display panel 10 used in a display apparatus 1 according to another embodiment of the disclosure.

Referring to FIG. 5, the transparent fixing member 12 may be formed by applying a transparent resin in a liquid state on the upper surfaces of the plurality of unit modules 11 arranged in the matrix form in such a way to encapsulate (or cover) the upper surfaces of the substrates 11 and the inorganic light emitting devices 112a, 112b, and 112c and hardening the transparent resin thereafter.

Therefore, the inorganic light emitting devices 112a, 112b, and 112c may be more stably mounted and fixed on the upper surfaces of the substrates 111 through the transparent fixing member 12.

By arranging the plurality of unit modules 11 in a matrix form on a resting portion 31 of a jig 3, applying a transparent resin in a liquid state on the upper surfaces of the unit modules 11 and then hardening the transparent resin to form the transparent fixing member 12, the plurality of unit modules 11 may be integrated into one body while being maintained in the matrix form by means of the transparent fixing member 12.

Because the transparent resin is applied in the liquid state on the upper surfaces of the plurality of unit modules 11, a portion of the transparent resin may enter gaps G between the unit modules 11 and be hardened in the gaps G between the unit modules 11, as shown in FIG. 7. Accordingly, side surfaces of the unit modules 11 may also be fixed with respect to each other as the transparent fixing member 12 is formed. Also, borders between the unit modules 11 may become invisible by the transparent resin seeping through the gaps G between the unit modules 11 and hardened.

The transparent resin forming the transparent fixing member 12 may be an optical clear resin (OCR), and protect the inorganic light emitting devices 112a, 112b, and 112c while preventing an optical distortion of light passing through the transparent fixing member 12. The transparent resin may also be a thermosetting resin that is hardened by heat or an ultraviolet (UV) hardening resin that is hardened by UV light.

Figure 8:
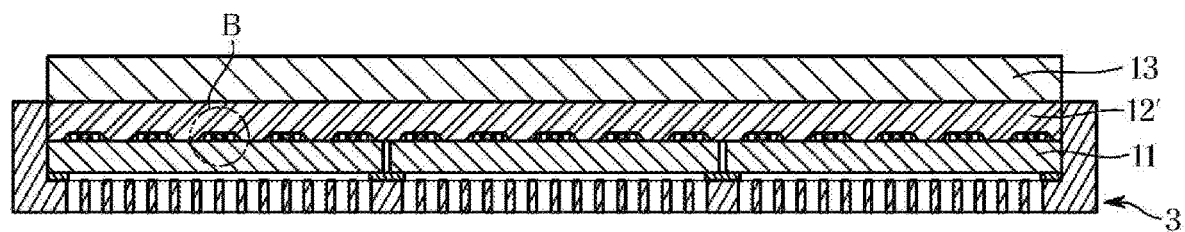
FIG. 8 is a cross-sectional view of a display panel used in a display apparatus according to another embodiment of the present disclosure.
Figure 9:
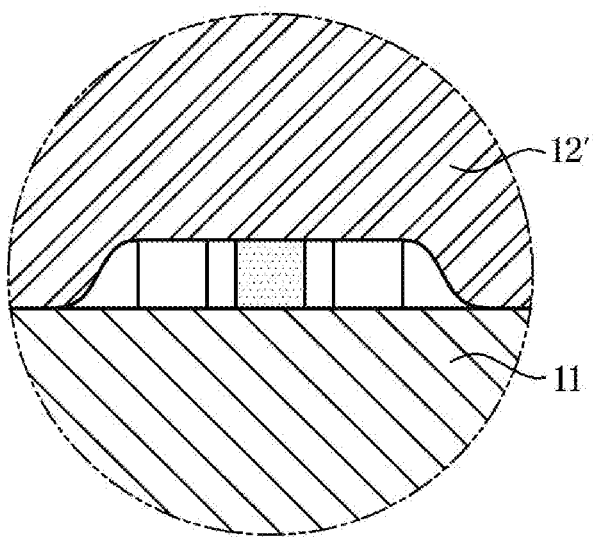
FIG. 9 is an enlarged view of an area B of FIG. 8.

FIG. 8 is a cross-sectional view of a display panel 10 used in a display apparatus 1 according to another embodiment of the disclosure. FIG. 9 is an enlarged view of an area B of FIG. 8. Referring to FIGS. 2 and 8, the glass panel 13 may be formed as a rectangular plate made of a transparent material such as tempered glass and may be fixed to cover or encapsulate the front surfaces of the plurality of unit modules 11.

As described above, the transparent fixing member 12 may be formed by hardening the transparent resin in the liquid state. Accordingly, by attaching the glass panel 13 on the plurality of unit modules 11 through the transparent resin before the transparent resin is hardened and then hardening the transparent resin, the transparent fixing member 12 may be formed according to hardening of the transparent resin so that the plurality of unit modules 11, the transparent fixing member 12, and the glass panel 13 are integrated into one body to form the display panel 10.

Referring back to FIGS. 3 and 4, the jig 3 for fixing the plurality of unit modules 11 may include the resting portion 31 having an upper surface on which the plurality of unit modules 11 are arranged in a matrix form, a dam portion 32 positioned at edges of the resting portion 31 to accommodate and support the transparent resin in the liquid state in the resting portion 31, and a blocking member 33 covering the lower areas of the gaps G between the unit modules 11.

The resting portion 31 may include a plurality of adsorption holes 31a which are formed to correspond to the plurality of unit modules 11 except for the edges of the plurality of unit modules 11 and to which negative pressure is transferred, and the blocking member 33 positioned to correspond to the edges of the plurality of unit modules 11 and covering the lower areas of the gaps G between the adjacent unit modules 11.

The dam portion 32 may protrude upward so that the upper end is higher than an upper surface of the resting portion 31. Accordingly, the transparent resin in the liquid state may be collected on the plurality of unit modules 11 provided on the resting portion 31 located in the inside of the dam portion 32.

The blocking member 33 may function to prevent negative pressure applied to the adsorption holes 31a from being transferred to the gaps between the adjacent unit modules 11.

A part of the transparent resin in the liquid state as described above may enter the gaps G between the unit modules 11. However, because the lower areas of the gaps G between the unit modules 11 are covered with the blocking member 33, an amount of the transparent resin entering the gaps G between the unit modules 11 may be limited to a predetermined amount or less.

The glass panel 13 may be fixed on the plurality of unit modules 11 by means of the transparent fixing member 12 formed according to hardening of the transparent resin. However, the embodiment is not limited thereto. For example, a transparent fixing member 12' may be formed with an adhesive film or an optical clear adhesive (OCA) in the form of a sheet, as shown in FIGS. 8 and 9.

Also, in the embodiment, the transparent fixing member 12 may perform both a function of fixing the unit modules 11 arranged in the matrix form with respect to each other and a function of fixing the glass panel 13 on the plurality of unit modules 11. However, the embodiment is not limited thereto. For example, as shown in FIG. 10, the transparent fixing member 12 may perform a function of fixing the glass panel 13 on one unit module 11.

Hereinafter, a method of manufacturing the display panel 10 of the display apparatus 1 according to an embodiment of the disclosure will be described in detail with reference to the accompanying drawings.

First, as shown in FIG. 3, the plurality of light emitting device groups 112 may be mounted on a plurality of substrates 111 to form the plurality of unit modules 11.

Then, as shown in FIG. 4, the plurality of unit modules 11 may be arranged on the resting portion 31 of the jig 3 to in a matrix form. The plurality of light emitting device groups 112 mounted on the substrate 11 may be spaced apart from each other at a predetermined interval. That is, an interval G1 between the light emitting device groups 112 arranged on one unit module 11 may be equal to an interval G2 between two light emitting device groups 112 arranged to be adjacent to each other on two neighboring unit modules 11 among the plurality of unit modules 11.

As shown in FIG. 5, when negative pressure is applied to the adsorption holes 31a in the state in which the plurality of unit modules 11 are arranged in the matrix form on the resting portion 31, the plurality of unit modules 11 may be adsorbed on the resting portion 31 so as not to move.

A transparent resin in the liquid state may be applied or poured onto the upper surfaces of the plurality of unit modules 11 adsorbed on the resting portion 31 of the jig 3. The transparent resin may be collected in the resting portion 31 by the dam portion 32 of the jig 3, and therefore, the upper surfaces of the substrates 111 and the inorganic light emitting devices 112a, 112b, and 112c may be covered with the transparent resin in the liquid form.

At this time, a part of the transparent resin may enter the gaps G between the adjacent unit modules 11. However, the blocking member 33 blocking the bottom portion of the gaps G may prevent the negative pressure applied to the adsorption holes 31a from being transferred to the unit modules 11. Accordingly, an amount of the transparent resin entering the gaps G between the unit modules 11 may be limited to a predetermined amount so that the transparent resin may be prevented from leaking downward through the gaps G between the adjacent unit modules 11.

Then, as shown in FIG. 6, the glass panel 13 may be disposed on the upper surface of the transparent resin, and then, the transparent resin may be hardened to form the transparent fixing member 12. When the transparent resin is a UV hardening resin, UV light may be radiated onto the upper surface of the glass panel 13 to harden the transparent resin, thereby forming the transparent fixing member 12 attached to the glass panel 13.

The transparent resin may be hardened in the state of covering the upper surfaces of the substrates 111 and the inorganic light emitting devices 112a, 112b, and 112c to form the transparent fixing member 12. Therefore, the plurality of unit modules 11 may be fixed with respect to one another through the transparent fixing member 12, and the inorganic light emitting devices 112a, 112b, and 112c mounted on the substrates 111 may be more stably mounted on the substrates 111.

Also, because the transparent resin is hardened to form the transparent fixing member 12 in the state in which the glass panel 13 is positioned on the upper surface of the transparent resin, the glass panel 13 may be thereby fixed on the upper surfaces of the plurality of unit modules 11 through the transparent fixing member 12.

As described above, because the display panel 10 includes the glass panel 13 integrated through the transparent fixing member 12, the display apparatus 1 may be constituted in a reduced size.

As described above, the display apparatus according to an aspect of the disclosure may be constituted in a reduced size by integrating the plurality of unit modules and the glass panel into one body through the fixing member so that the display panel includes the glass panel.

Although a embodiment of the disclosure have been shown and described, it would be appreciated by those skilled in the art that changes may be made in the embodiments without departing from the principles and spirit of the disclosure, the scope of which is defined in the claims and their equivalents.

What is claimed is:

1. A display apparatus comprising:
   a display panel to display an image, and
   a case to support the display panel;
   wherein the display panel comprises:
      a plurality of unit modules arranged in a matrix form, each unit module of the plurality of unit modules including a substrate and a plurality of inorganic light emitting devices mounted on the substrate to from pixels of the display panel;

a transparent fixing member encapsulating the plurality of unit modules and fixing the plurality of unit modules; and a glass panel attached on the plurality of unit modules by means of the transparent fixing member.

2. The display apparatus according to claim 1, wherein the transparent fixing member is formed based on a transparent resin being applied on the plurality of unit modules and the transparent resin being hardened.

3. The display apparatus according to claim 2, wherein a portion of the transparent resin enters a gap between adjacent unit modules of the plurality of unit modules and the transparent resin is hardened in the gap.

4. The display apparatus according to claim 2, wherein the transparent resin is an ultraviolet (UV) hardening resin configured to be hardened based on UV light being radiated onto the transparent resin.

5. The display apparatus according to claim 1, wherein the transparent fixing member comprises a transparent adhesive film that is attached on the plurality of unit modules.

6. The display apparatus according to claim 1, wherein each inorganic light emitting device of the plurality of inorganic light emitting devices comprises a plurality of light emitting device groups, each inorganic light emitting device group of the plurality of inorganic light emitting device groups comprising:

a red inorganic light emitting device;
a green inorganic light emitting device; and
a blue inorganic light emitting device, the red, green and blue inorganic light emitting devices configured to form a pixel.

7. The display apparatus according to claim 6, wherein the plurality of light emitting device groups are spaced at a predetermined interval.

8. The display apparatus according to claim 1, wherein the case covers at least one outer side surface of the unit modules disposed at outermost of the plurality of unit modules.

9. A method of manufacturing a display apparatus, comprising:

forming a unit module of a plurality of unit modules by mounting a plurality of inorganic light emitting devices on a substrate;
arranging the plurality of unit modules in a matrix form;
applying a transparent resin in a liquid state to cover the plurality of unit modules;
attaching a glass panel to the plurality of unit modules by means of the transparent resin; and
hardening the transparent resin to form a transparent fixing member for fixing the plurality of unit modules,
wherein the arranging comprises arranging the plurality of unit modules in the matrix form on a jog,
wherein the jig includes:
a resting portion on which the plurality of unit modules are provided, and
a plurality of adsorption holes provided in the resting portion corresponding to the plurality of unit modules, and
wherein, based on negative pressure being applied to the plurality of adsorption holes, the plurality of unit modules are adsorbed on the resting portion.

10. The method according to claim 9, wherein the jig further comprises a dam portion positioned at surrounding edges of the resting portion, and
wherein the transparent resin in the liquid state applied on the plurality of unit modules is collected in the resting portion by the dam portion.

11. The method according to claim 9, wherein the jig further comprises a blocking portion covering a lower end of a gap provided between adjacent unit modules to limit an amount of the transparent resin entering the gap.

12. A method of manufacturing a display apparatus, the method comprising:

arranging, in a jig, a plurality of unit modules in a matrix form, each unit module of the plurality of unit modules comprising:
a substrate; and
a plurality of inorganic light emitting devices provided on the substrate of the unit module;
applying a transparent resin in a liquid state in the jig to cover the plurality of unit modules;
attaching a glass panel to the plurality of unit modules by means of the transparent resin; and
hardening the transparent resin to form a transparent fixing member for fixing the plurality of unit modules,
wherein the arranging comprises arranging a first unit module, from among the plurality of unit modules, and a second unit module, from among the plurality of unit modules, that is adjacent to first module, with a gap directly between the substrate of the first unit module and the substrate of the second unit module, and
wherein a portion of the transparent fixing member is within the gap.

13. The method according to claim 12, wherein the applying the transparent resin in the liquid state comprises:
providing the transparent resin in the liquid state in the gap between the first unit module and the second unit module, and
hardening the transparent resin in the liquid state in the gap between the first unit module and the second unit module.

14. The method according to claim 12, wherein the jig comprises:
a resting portion on which the plurality of unit modules are provided, and
a plurality of adsorption holes provided in the resting portion corresponding to the plurality of unit modules, and
wherein, based on negative pressure being applied to the plurality of adsorption holes, the plurality of unit modules are adsorbed on the resting portion.

15. The method according to claim 14, wherein the jig further comprises a dam portion positioned at surrounding edges of the resting portion, and
wherein the transparent resin in the liquid state applied on the plurality of unit modules is collected in the resting portion by the dam portion.

16. The method according to claim 15, wherein the jig further comprises a blocking portion covering a lower end of the gap provided between the first unit module and the second unit module to limit an amount of the transparent resin entering the gap.

* * * * *